(12) United States Patent
Okubo et al.

(10) Patent No.: US 7,713,663 B2
(45) Date of Patent: May 11, 2010

(54) MASK BLANK, MANUFACTURING METHOD OF MASK BLANK, MANUFACTURING METHOD OF TRANSFER MASK AND MANUFACTURING METHOD OF SEMICONDUCTOR DEVICE

(75) Inventors: Yasushi Okubo, Tokyo (JP); Yasunori Yokoya, Tokyo (JP)

(73) Assignee: Hoya Corporation, Tokyo (JP)

( * ) Notice: Subject to any disclaimer, the term of this patent is extended or adjusted under 35 U.S.C. 154(b) by 955 days.

(21) Appl. No.: 10/551,136

(22) PCT Filed: Mar. 31, 2004

(86) PCT No.: PCT/JP2004/004617
§ 371 (c)(1),
(2), (4) Date: Jan. 5, 2006

(87) PCT Pub. No.: WO2004/088421
PCT Pub. Date: Oct. 14, 2004

(65) Prior Publication Data
US 2007/0111490 A1 May 17, 2007

(30) Foreign Application Priority Data
Mar. 31, 2003 (JP) .............................. 2003-096910

(51) Int. Cl.
*G03F 1/00* (2006.01)
(52) U.S. Cl. ........................................................ 430/5
(58) Field of Classification Search ............... 430/5, 430/311, 312, 313, 394; 428/428, 430
See application file for complete search history.

(56) References Cited

U.S. PATENT DOCUMENTS

| | | | |
|---|---|---|---|
| 6,514,642 B2 | 2/2003 | Okazaki et al. | |
| 6,641,958 B2 | 11/2003 | Inazuki et al. | |
| 7,226,705 B2 * | 6/2007 | Hata | 430/5 |
| 7,238,454 B2 * | 7/2007 | Kobayashi et al. | 430/5 |
| 2002/0000424 A1 | 1/2002 | Hata | |

(Continued)

FOREIGN PATENT DOCUMENTS

JP    A 64-86520    3/1989

(Continued)

*Primary Examiner*—Stephen Rosasco
(74) *Attorney, Agent, or Firm*—Oliff & Berridge, PLC

(57) ABSTRACT

In the photomask blank 100, which is an original plate of a transfer mask having a transfer pattern to be transferred to the body to be subjected to transfer on the substrate 10, the photomask blank 100 includes a light shielding film 20 becoming the transfer pattern and a resist film 30 on the substrate 10, and the resist film 30 formed on the peripheral edge of the main surface of the substrate 10 is removed in a predetermined region in a supported region 31 of the photomask blank 100 supported by the substrate holding member of the exposure device, so that a desired pattern positional accuracy and a desired focus accuracy are obtained, when the transfer mask having the transfer pattern obtained by patterning the light shielding film 20 is supported by the substrate holding member of the exposure device. With this structure, when a reticle is mounted on the substrate holding member of a stepper, the deformation of the reticle is suppressed, and lowering of a positional accuracy of the transfer pattern and the lowering of a focus accuracy can be suppressed to minimum.

13 Claims, 6 Drawing Sheets

U.S. PATENT DOCUMENTS

2002/0052100 A1   5/2002   Tanaka et al.

FOREIGN PATENT DOCUMENTS

| JP | A 1-125828 | 5/1989 |
| JP | A 4-40456 | 2/1992 |
| JP | A 5-53290 | 3/1993 |
| JP | A 8-17708 | 1/1996 |
| JP | A 2001-259502 | 9/2001 |
| JP | A 2002-131883 | 5/2002 |
| TW | 489418 | 6/2002 |
| TW | 520462 | 2/2003 |

* cited by examiner

MASK BLANK, MANUFACTURING METHOD OF MASK BLANK, MANUFACTURING METHOD OF TRANSFER MASK AND MANUFACTURING METHOD OF SEMICONDUCTOR DEVICE

TECHNICAL FIELD

The present invention relates to a mask blank, which is an original plate for manufacturing a transfer mask, a manufacturing method of the mask blank, the manufacturing method of a transfer mask and the manufacturing method of a semiconductor device.

BACKGROUND ART

In a field of manufacturing a semiconductor device and a photomask or the like, it is frequently required that an unnecessary part of a resist film formed on a main surface of a substrate is removed. For example, when a resist film is applied on the substrate, by adopting a spin coating method for forming a uniform resist film on the substrate by dripping a coating liquid on a horizontally held substrate, and using a centrifugal force which is caused by rotating the substrate, a film thickness of a peripheral edge becomes large, because when the substrate is rotated at a low speed so that the coating film is uniformly formed on an entire surface of the substrate, the centrifugal force which acts on the peripheral edge of the substrate surface becomes smaller, whereby resist liquid remains on the peripheral edge of the substrate surface. When the film thickness becomes large as described above, whereby build-up of the peripheral edge of the substrate surface occurs, a problem is involved therein as described below.

Specifically, in a manufacturing step of the photomask blank, the substrate is kept by a transfer mechanism and is inserted in and pulled out from a substrate housing case, in a course passing through each kind of processing step after the resist is formed on the substrate surface. At this time, the peripheral edge of the substrate comes into contact with a chuck part of the transfer mechanism and a housing groove of the housing case, whereby the resist film of the peripheral edge of the substrate is released therefrom, to become a source of discharging dust, and the released resist adheres to the main surface of the photomask blank, and a defect is thereby generated.

Therefore, in order to avert the aforementioned situation, the substrate is subjected to spin-coating to form the resist film on the substrate, and thereafter the resist film on the peripheral edge of the substrate is removed. In the processing, a chemical liquid by which the resist is dissolved is fed to the resist on the peripheral edge of the substrate while rotating the substrate horizontally around a specified rotation center, and the resist film on the peripheral edge of the substrate is thereby dissolved and removed.

For example, a technique to remove the unnecessary resist film on the peripheral edge of the substrate includes a method disclosed in Japanese Patent Application No. 2001-259502.

The method of removing the unnecessary film comprises: forming the resist film by the spin-coating method, covering the surface of the substrate with a cover member formed with a plurality of fine holes on the peripheral edge of the substrate (part located in the upper part of the unnecessary film to be removed), and feeding the chemical liquid (solvent), by which the resist is dissolved, from above this cover member, while the substrate and the cover member are integrally rotated. The solvent thus fed is fed to the peripheral edge of the substrate through the fine holes, and the resist formed on the peripheral edge of the substrate is thereby dissolved and removed.

Note that an alignment mark and a QA (quality assurance) pattern are formed on the peripheral edge of the substrate, and therefore the resist film is removed in an area of about several millimeters from a substrate side surface, so that a pattern defects of the alignment mark and the QA pattern do not occur.

DISCLOSURE OF THE INVENTION

Out of the aforementioned photo mask blank, a transfer mask (in some cases, described as a reticle hereunder) mounted on an exposure device (in some cases, described as a stepper hereunder) for pattern transfer and used as a mask for a reduction exposure device during manufacturing a semiconductor integrated circuit, has a pattern composed of a light shielding film containing chrome or the like formed by sputtering or the like on a transparent glass substrate whose main surface at least is finished into a mirror face. Usually, the reticle is attached onto the main surface of the substrate on which the transfer pattern is formed. Then, when the reticle is attached, it is vacuum-chucked to the peripheral edge of the main surface of the substrate, so as to have a wide pattern area and so as to place the substrate in the proper position when the stepper is in operation.

FIG. 11, is a schematic sectional view showing a suction mechanism of a typical reticle in the stepper.

In FIG. 11, a reticle 1 is sucked by a substrate holding member 6 and set in a substrate holding device 5. The substrate holding member 6 is connected to a vacuum unit (not shown) through a suction pipe 8, and the reticle 1 is sucked by the vacuum unit.

In the reticle 1, although a supported area, with which the substrate holding member 6 comes into contact, is different depending on each exposure device manufacturer, it is about within over 10 millimeters from the substrate side surface.

When the photomask is prepared by using the photomask blank from which the resist film on the substrate peripheral edge is removed, several millimeter area from the substrate side surface, where the light shielding film is exposed, is removed during an etching process of a photomask manufacturing step. Therefore, when the border of the light shielding film enters in the area corresponding to the substrate holding member 6, a level difference is generated by a film thickness of the light shielding film (usually, about 1000 angstrom). Accordingly, in association with a microfabrication of a pattern hereafter, such risk is estimated that the vacuum-chucked reticle is deformed, a positional accuracy of the reticle (transfer pattern) is lowered, and a focus accuracy is lowered, resulting from the level difference thus generated. The aforementioned problem is remarkably involved in the mask blank and the transfer mask for exposure by an ArF excimer laser (wavelength: 193 nm) targeting 65 nm node by a semiconductor design rule, and F2 excimer laser (wavelength: 157 nm) with a shorter wavelength than the wavelength of the ArF excimer laser.

Therefore, in view of the aforementioned problem, an object of the present invention is to provide a mask blank capable of suppressing a deformation of a transfer mask when the transfer mask is mounted on a substrate holding member of an exposure device, suppressing lowering of the positional accuracy of a transfer pattern to minimum, and suppressing the lowering of a focus accuracy to minimum and a manufacturing method of the same, and the manufacturing method of the transfer mask.

In order to solve the above-described problem, the present invention takes several structures as follows.

(Structure 1)

In a first structure, a mask blank is provided, which is an original plate for manufacturing a transfer mask, having on a substrate main surface a thin film, on which a transfer pattern is formed when the transfer mask is manufactured, and a resist film, which is used when the transfer mask is manufactured, comprising on a peripheral edge of the substrate main surface:

a forming region of an auxiliary pattern which is formed on the transfer mask, when the transfer mask is manufactured by the mask blank; and a supported region of the mask blank, which is a region supported by a substrate holding member of an exposure device when a transfer is carried out by using the transfer mask, the supported region of the mask blank further comprising:

a region where no resist film is formed, wherein the region where no resist film is formed is the region selected in a range in which the transfer mask is held with a desired positional accuracy of the transfer pattern and a desired focus accuracy, when the transfer is performed by supporting the transfer mask manufactured by the mask blank, by the substrate holding member of the exposure device.

(Structure 2)

In a second structure, the mask blank according to the first structure is provided, wherein the thin film and the resist film are formed in the auxiliary pattern forming region.

(Structure 3)

In a third structure, a mask blank is provided, which is an original plate for manufacturing a transfer mask, having on a substrate main surface a thin film, on which a transfer pattern is formed when the transfer mask is manufactured, and a resist film, which is used when the transfer mask is manufactured, comprising on a peripheral edge of the substrate main surface:

a forming region of an auxiliary pattern which is formed on the transfer mask, when the transfer mask is manufactured by the mask blank; and a supported region of the mask blank, which is a region supported by a substrate holding member of an exposure device when a transfer is carried out by using the transfer mask, wherein the supported region of the mask blank includes a region where the resist film is not exposed to light, and the region where the resist film is not exposed to light is the region from which the resist film is removed when the resist film is developed, and the region from which the resist film is removed is the region selected in a range in which the transfer mask is held with a desired positional accuracy of the transfer pattern and a desired focus accuracy, when the transfer is performed by supporting the transfer mask manufactured by the mask blank, with the resist film removed, by the substrate holding member of the transfer device.

(Structure 4)

In a fourth structure, the photomask blank according to the structure 3 is provided, wherein the auxiliary pattern forming region is the non-exposure region which is not exposed to light.

(Structure 5)

In a fifth structure, a manufacturing method of a mask blank is provided, which is an original plate for manufacturing a transfer mask, comprising:

a thin film forming process for forming a thin film on a substrate main surface, on which a transfer pattern is formed when the transfer mask is manufactured;

a resist coating process for applying a positive resist on the thin film; and a thermal treatment process for thermally treating the resist thus applied, wherein a mask blank comprises on a peripheral edge of the substrate main surface:

an auxiliary pattern forming region which is formed on the transfer mask, when the transfer mask is manufactured by the mask blank; and a supported region of the mask blank, which is a region supported by a substrate holding member of an exposure device when a transfer is carried out by using the transfer mask, wherein the supported region of the mask blank includes a region where the resist film is not exposed to light, and the region where the resist film is not exposed to light is the region from which the resist film is removed when the resist film is developed, and the region where the resist film is removed is the region selected in a range in which the transfer mask is held with a desired positional accuracy of the transfer pattern and a desired focus accuracy, when the transfer is performed by supporting the transfer mask manufactured by the mask blank by the substrate holding member of the transfer device, with the resist film removed.

(Structure 6)

In a sixth structure, the manufacturing method of the mask blank according to the fifth structure is provided, comprising:

an exposure process of an unnecessary resist film formed on the peripheral edge of the substrate main surface; and a resist film removing process for removing the unnecessary resist film formed on the peripheral edge of the substrate main surface and the resist film formed in the supported region, by selectively supplying a developing solution to the exposure region after the exposure process.

(Structure 7)

In a seventh structure, a manufacturing method of a transfer mask is provided, for jointly removing the thin film formed in the supported region already exposed to light during formation of a transfer pattern, in an etching processing step in the transfer mask manufacturing step where the mask blank obtained by the manufacturing method of the mask blank according to claim 5 is used.

(Structure 8)

In an eighth structure, a manufacturing method of a transfer mask is provided, for manufacturing the transfer mask by using a mask blank formed with a thin film on which a transfer pattern is formed on a substrate main surface and a positive resist film formed on the thin film, thereby forming a pattern on the thin film, wherein the peripheral edge of the transfer mask includes a supported region, which is a region supported by a substrate holding member of an exposure device when transfer is performed, and the supported region further includes the region where the thin film is not formed, and the region where the thin film is not formed is the region selected in a range in which the transfer mask is held with a desired positional accuracy of the transfer pattern and a desired focus accuracy, when the transfer is performed by supporting the transfer mask by the substrate holding member of the exposure device.

(Structure 9)

A manufacturing method of a semiconductor device is provided, wherein the transfer mask obtained by the manufacturing method of the transfer mask according to the structure 8 is used to form a pattern by transferring the transfer pattern on a semiconductor substrate by a lithography method.

According to the aforementioned structure 1, the supported region of the mask blank present in the peripheral edge of the substrate main surface has the region where the resist film is not formed, which is the region selected in the range where the transfer mask is held with a desired positional accuracy of the transfer pattern and a desired focus accuracy, when the transfer is performed by supporting the transfer mask manufactured by the mask blank by the substrate holding member of the exposure device. When only the resist film is not formed in the supported region, the thin film in the supported region is removed during formation of the transfer pattern in an etching processing step in a transfer mask manufacturing step.

Accordingly, the thin film is not formed in the supported region, which greatly affects the lowering of the pattern positional accuracy and the focus accuracy, and the substrate is thereby exposed, and therefore the deformation of a vacuum-chucked transfer mask can be suppressed by the substrate holding member of the exposure device. Therefore, the lowering of the positional accuracy of the transfer pattern can be suppressed to minimum, and the lowering of the focus accuracy can be suppressed to minimum.

The supported region, where the thin film and the resist film are not formed by a removing method or the like, is different in accordance with the substrate holding member of the exposure device, and may be an entire body of the supported region which is made to abut against the substrate, or may be the supported region except the auxiliary pattern forming region formed with the auxiliary pattern, when the auxiliary pattern forming region formed with the auxiliary pattern not transferred to the semiconductor substrate such as a barcode pattern, QA pattern, an alignment mark, and a pellicle positioning mark enters the supported region. In accordance with the pattern positional accuracy and the focus accuracy required in association with the microfabrication of the pattern, a predetermined region, where the thin film and the resist film are not formed, is properly determined.

According to the structure 2, the thin film and the resist film are formed in the auxiliary pattern forming region, whereby a pattern defect of the auxiliary pattern such as the barcode pattern, QA pattern, the alignment mark, and the pellicle positioning mark can be prevented.

According to the structures 3 and 5, when the transfer mask having the transfer pattern obtained by patterning the thin film is supported by the substrate holding member of the exposure device, the positive resist film formed in the peripheral edge of the substrate main surface is exposed to light in the supported region of the mask blank supported by the substrate holding member of the exposure device, thereby obtaining the dissolution speed difference by developing solution between the exposure region and the non-exposure region. Therefore, the resist film formed in the supported region, which acts as a trigger to lower the pattern positional accuracy and the focus accuracy, can be easily removed in a development processing step in the transfer mask manufacturing step and in a resist film removing step in a mask blank manufacturing step for removing the unnecessary resist film by supplying developing solution to only the exposure region.

According to the structure 4, the auxiliary pattern forming region is the non-exposure region which is not exposed to light. Therefore, in the development processing step in the transfer mask manufacturing step, the resist film remains in the auxiliary pattern forming region such as the barcode pattern, QA pattern alignment mark, and pellicle positioning mark, and the pattern defect of such auxiliary patterns can be prevented.

According to the structure 6, in the manufacturing step of the mask blank, the unnecessary resist films formed in the supported region and in the peripheral edge of the substrate main surface are also exposed to light, and thereafter the resist film formed in the supported region is removed by selectively supplying the developing solution to the exposure region. Therefore, the resist film is prevented from releasing by coming into contact with the chuck part for grasping the mask blank during transfer and a housing groove in a mask blank housing case.

According to the structure 7, in an etching processing step in the transfer mask manufacturing step in which the mask blank obtained by the manufacturing method of the structure 5 is used, the thin film is also removed in the supported region already exposed to light, which greatly affects the lowering of the pattern positional accuracy and the focus accuracy. Therefore, the substrate is exposed, and the deformation of the transfer mask vacuum-chucked to the substrate holding member of the exposure device can be prevented. Therefore, the lowering of the positional accuracy of the transfer pattern can be suppressed to minimum and the lowering of the focus accuracy can be suppressed to minimum.

According to the structure 8, in a manufacturing process of the transfer mask (such as a drawing step and a development step), the light shielding film and the resist film are designed not to be formed in a predetermined region in the supported region of the transfer mask supported by the substrate holding member of the exposure device. Therefore, in the stage of the mask blank, which is the original plate of the transfer mask, it is not necessary to perform a processing of not forming the light shielding film and the resist film in the supported region. Therefore, the conventional mask blank with resist film can be used as it is.

According to the structure 9, a pattern is formed on the semiconductor substrate by using the transfer mask having no thin film formed in the supported region supported by the substrate holding member of the exposure device, thereby transferring the transfer pattern by the exposure device. Therefore, the semiconductor device capable of suppressing the lowering of the pattern positional accuracy to minimum can be obtained.

BRIEF DESCRIPTION OF THE DRAWINGS

FIG. 1(a) is a plan view and FIG. 1(b) is a sectional view.

FIG. 2(a) is a plan view and FIG. 2(b) is a sectional view.

FIG. 3(a) is a plan view and FIG. 3(b) is a sectional view.

FIG. 4(a) is a plan view and FIG. 4(b) is a sectional view.

FIG. 5(a) is a sectional view, and FIG. 5(b) is a sectional view taken along the line A-A.

FIG. 10(a) is a sectional view and FIG. 10(b) is a plan view.

10: SUBSTRATE
20: LIGHT SHIELDING FILM
30: RESIST FILM
31: SUPPORTED REGION
32: AUXILIARY PATTERN FORMING REGION
50: TURNTABLE
60: CHEMICAL SUPPLYING HOLE
62: FLAT PART
63: INCLINED PART
64: PERIPHERAL FLAT PART
65: SIDE PART
67: FITTING GROOVE
68: CHEMICAL SUPPLYING MEMBER
69: HOLE
70: NOZZLE
80: CHEMICAL LIQUID
90: THREAD
100, 101: PHOTO MASK BLANK

BEST MODE FOR CARRYING OUT THE INVENTION

Hereunder, embodiments of the present invention will be explained with reference to the drawings.

First Embodiment

Figure 1:
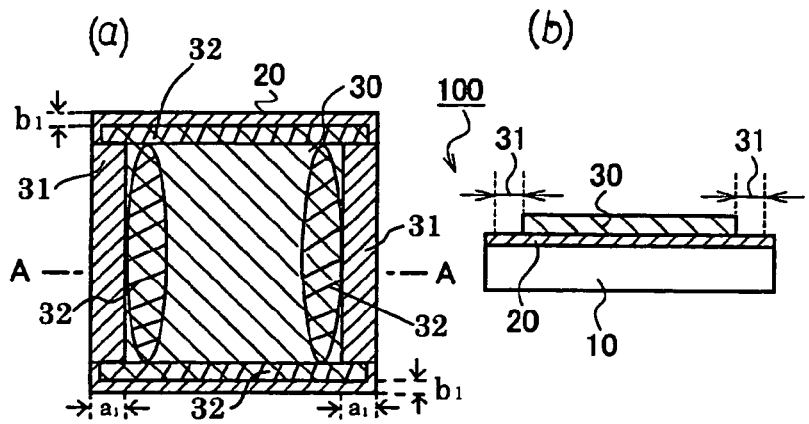
FIG. 1 is an explanatory view of a photomask blank according to a first embodiment.

FIG. 1 is a view showing a photomask blank of a first embodiment, from which a resist film is removed, formed in a supported region corresponding to a substrate holding member of an exposure device. FIG. 1(a) is a plan view of the photomask blank viewed from the side where the resist film is formed, and FIG. 1(b) is a sectional view taken along the line A-A.

A photomask blank 100 is composed of a substrate 10 having transparency for the exposure light, a light shielding film 20 formed on a main surface of the substrate 10, and a resist film 30 formed on the light shielding film 20. The resist film 30 formed on an unnecessary region of a substrate peripheral edge and a supported region 31 corresponding to a substrate holding member of an exposure device (two places in total such as one in the left side and one in the right side) is removed. Accordingly, the resist film is prevented from releasing by coming into contact with a chuck part for grasping the photomask during transferring and a housing groove in a mask blank housing case. In addition, a thin film in the supported region is removed during formation of the transfer pattern in a development processing step in a transfer mask manufacturing step. Therefore, a deformation of a reticle which is vacuum-chucked to the substrate holding member of the exposure device is prevented, because no level difference by a thickness of the thin film is generated, with the substrate in the supported region exposed, whereby lowering of a positional accuracy of the transfer pattern and a lowering of a focus accuracy can be suppressed to minimum. In addition, the resist film 30 is not removed and remains in an auxiliary pattern forming region 32 except the supported region 31 formed in the peripheral edge of the substrate main surface. Therefore, no pattern defect of an auxiliary pattern is generated.

Second Embodiment

Figure 2:
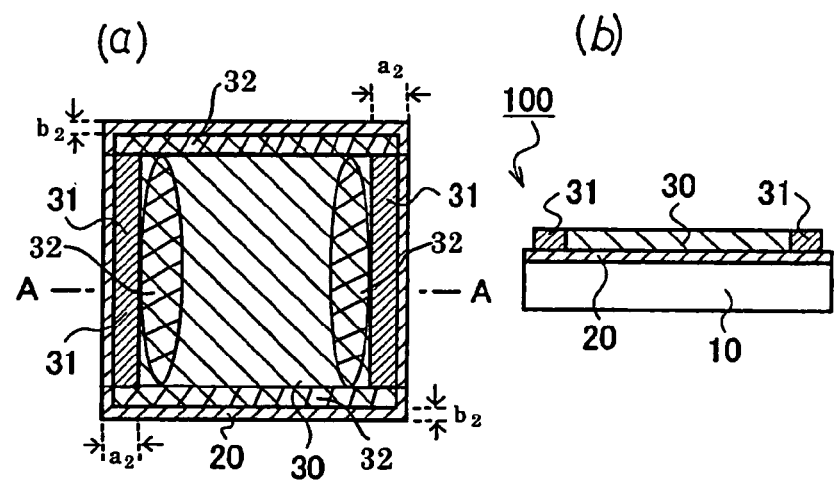
FIG. 2 is an explanatory view of the photomask blank according to a second embodiment.

FIG. 2 is a view showing the photomask blank of a second embodiment, in which an unnecessary resist film in the substrate peripheral edge is removed and the supported region corresponding to the substrate holding member of the exposure device is exposed to light, whereby a dissolution speed difference by developing solution is obtained between an exposure region and a non-exposure region. FIG. 2(a) is a plan view of the photomask blank viewed from the side where the resist film is formed, and FIG. 2(b) is a sectional view taken along the line A-A.

The photomask blank 100 is composed of the substrate 10 having transparency for the exposure light, the light shielding film 20 formed on the main surface of the substrate 10, and the resist film 30 formed on the light shielding film 20. The resist film 30 formed in an unnecessary region of the substrate peripheral edge is removed, and the resist film 30 formed in the supported region 31 (two places in total such as one in the left side and one in the right side) corresponding to the substrate holding member of the exposure device is exposed to light, whereby the dissolution speed difference by developing solution is obtained between the exposure region and the non-exposure region.

Therefore, since the resist film 30 formed in the unnecessary region of the substrate peripheral edge is removed, the resist film is prevented from releasing by coming into contact with the chuck part for grasping the photomask blank during transferring and the housing groove in the mask blank housing case. In addition, the resist film of the supported region already exposed to light is also removed during formation of the transfer pattern in the development processing step in the transfer mask manufacturing step. Therefore, the thin film in the supported region is removed during formation of the transfer pattern. Accordingly, the deformation of the reticle which is vacuum-chucked to the substrate holding member of the exposure device, is prevented, because no level difference by the thickness of the thin film is generated, with the substrate in the supported region exposed, whereby the lowering of positional accuracy of the transfer pattern and the lowering of the focus accuracy can be suppressed to minimum. Moreover, there is the non-exposure region, which is not exposed to light, in the auxiliary pattern forming region 32 except the supported region 31 formed in the peripheral edge of the substrate main surface, and the resist film 30 is not removed and remains even in the development processing step in the transfer mask manufacturing step. Therefore, no pattern defect of the auxiliary pattern is generated.

Note that the resist used in the second embodiment is selected to be a positive resist, because the exposure region is removed by the developing solution.

Further, it is possible to discriminate the exposure region from the non-exposure region in the photomask blank of the second embodiment, by a method of supplying the developing solution and by a difference of a refractive index and a transmittance depending on the resist.

Third Embodiment

Figure 3:
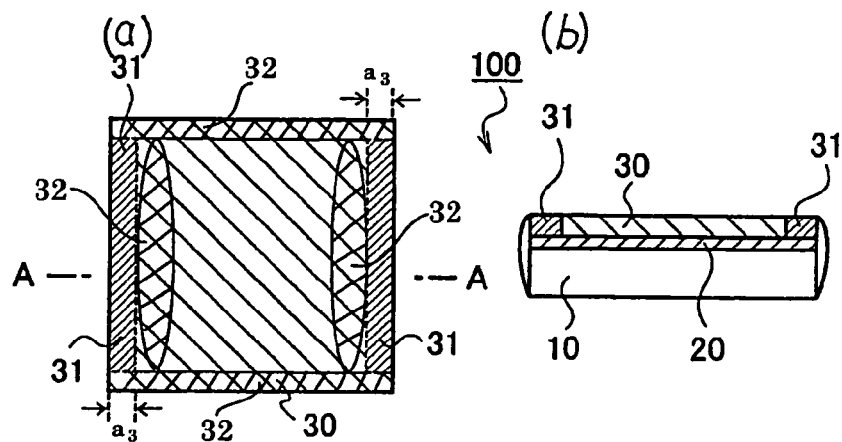
FIG. 3 is an explanatory view of the photomask blank according to a third embodiment.

FIG. 3 is a view showing the photomask blank in which the supported region corresponding to the substrate holding member of the exposure device is exposed to light, and the dissolution speed difference by developing solution is obtained between the exposure region and the non-exposure region. FIG. 3(a) is a plan view of the photomask blank viewed form the side where the resist film is formed, and FIG. 3(b) is a sectional view taken along the line A-A.

The photomask blank 100 is composed of the substrate 10 having transparency for the exposure light, the light shielding film 20 formed on the main surface of the substrate 10, and the resist film 30 formed on the light shielding film 20. The resist film 30 formed in the supported region 31 (two places in total such as one in the left side and one in the right side) corresponding to the substrate holding member of the exposure device is exposed to light, and the dissolution speed difference by developing solution is obtained between the exposure region and the non-exposure region. Accordingly, the resist film of the supported region which is already exposed to light is also removed during formation of the transfer pattern in the development processing step in the transfer mask manufacturing step. Therefore, the thin film in the supported region is removed during formation of the transfer pattern. Accordingly, the deformation of the reticle which is vacuum-chucked to the substrate holding member of the exposure device is prevented, because no level difference by the thickness of the thin film is generated, with the substrate in the supported region exposed. Then, the lowering of the positional accuracy of the transfer pattern and the lowering of the focus accuracy can be suppressed to minimum. In addition, there is the non-exposure region which is not exposed to light in the auxiliary pattern forming region 32 except the supported region 31 formed in the peripheral edge of the substrate main surface, and the resist film 30 is not removed and remains even in the development processing step in the transfer mask manufacturing step. Therefore, no pattern defect of the auxiliary pattern is generated.

Note that the resist used in the third embodiment is selected to be the positive resist, because the exposure region is removed by the developing solution.

In addition, in the same way as described above, it is possible to discriminate the exposure region from the non-exposure region in the photomask blank, by the method of supplying the developing solution and by the difference of the refractive index and the transmittance depending on the resist.

Fourth Embodiment

Figure 4:
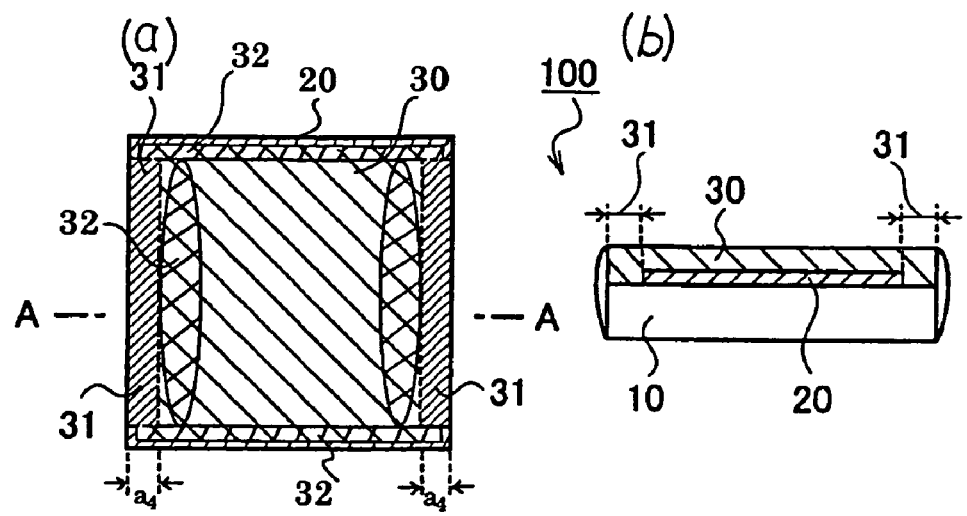
FIG. 4 is an explanatory view of the photomask blank according to a fourth embodiment.

FIG. 4 is a view showing the photomask blank of a fourth embodiment in which the thin film becoming the transfer pattern is not formed in the supported region corresponding to the substrate holding member of the exposure device. FIG. 4(a) is a plan view of the photomask blank viewed from the side where the resist film is formed, and FIG. 4(b) is a sectional view taken along the line A-A.

The photomask blank 100 is composed of the substrate 10 having transparency for the exposure light, the light shielding film 20 formed on the main surface of the substrate 10, and the resist film 30 formed on the light shielding film 20. The light shielding film 20 is formed by using a shielding member, so that the light shielding film 20 is not formed in the supported region 31 (two places in total such as one in the left side and one in the right side) corresponding to the substrate holding member of the exposure device, during formation of the film using a sputtering method.

Therefore, when the transfer mask is manufactured by using the photomask blank of the fourth embodiment, the deformation of the reticle which is vacuum-chucked to the substrate holding member of the exposure device is suppressed, because no level difference by the thickness of the thin film is generated, with the substrate in the supported region of the exposure device exposed. Thus, the lowering of the positional accuracy of the transfer pattern and the lowering of the focus accuracy can be suppressed to minimum. Further, the thin film is formed in the auxiliary pattern forming region 32 except the supported region 31 formed in the peripheral edge of the substrate main surface, and therefore the pattern defect of the auxiliary pattern is not generated. Moreover, in the aforementioned fourth embodiment, the photomask from which the unnecessary resist film in the substrate peripheral edge is removed may be used.

In the aforementioned embodiments 1 to 3, by way of example, explanation is given to a case in which the resist film on the whole surface of the supported region of the exposure device is removed or exposed to light. However, the case is not limited thereto, and in the transfer mask formed with the auxiliary pattern such as the barcode pattern and the QA pattern in the supported region, the resist film may be remained for a predetermined region (a part of or the whole part of the auxiliary pattern forming region such as the barcode pattern and the QA pattern) in the supported region where the deformation of the reticle which is vacuum-chucked to the substrate holding member of the exposure device is prevented, and the lowering of the positional accuracy of the transfer pattern and the lowering of the focus accuracy can be suppressed to minimum.

In the aforementioned first to fourth embodiments, a flatness in the supported region of the substrate is preferably selected to be 0.5 μm or less, so that the positional accuracy of the transfer pattern is not lowered, and further preferably selected to be 0.3 μm or less. In addition, as an end shape of the substrate, it is preferable to select a flagging shape (a rolled-edge shape) rather than a swollen shape swollen toward the side surface of the substrate. Here, the flatness refers to the difference between the maximum height and the minimum height of a surface shape in a main surface plane from a reference surface arbitrarily provided on the surface side of the substrate main surface (difference between the maximum value and the minimum value of a measurement planes on the basis of a virtual absolute plane (focal plane) calculated by the method of least squares.

Further, preferably the resist film formed in the peripheral edge of the substrate main surface except the supported region is also removed, to prevent the resist film from releasing by coming into contact with the chuck part for grasping the mask blank during transferring and the housing groove in the mask blank housing case. A removing width of the substrate main surface except the supported region is set at 1 to 3 mm, so that no pattern defect of the auxiliary pattern such as the alignment mark and the QA pattern is generated.

The mask blank specified in the present invention refers to either of a transmissive mask blank or a reflective mask blank, and in such structures, there are the thin film and the resist film on the substrate becoming the transfer pattern to be transferred to a body to be subjected to transfer.

The transmissive mask blank is the photomask blank in which a transparent substrate is used as the substrate, and the thin film to cause an optical change to the exposure light used for transferring to the body to be subjected to transfer is used as the thin film becoming the transferred pattern. Here, the thin film that causes the optical change to the exposure light refers to the light shielding film for shielding the exposure light and a phase shift film and so forth for changing a phase shift of the exposure light. Also, the thin film having light shielding function includes a so-called half tone film having a light shielding function and a phase shift function and the light shielding film having the light shielding function.

Accordingly, the transmissive mask blank includes the photomask blank formed with the light shielding film, the phase shift mask blank (half tone phase shift mask blank) formed with the half tone film, and the phase shift mask blank formed with the phase shift film.

Also, the reflective mask blank is the mask blank using the substrate having a small thermal expansion coefficient, and having a light reflective multi-layered film and a light absorbing body becoming the transferred pattern on the substrate.

Further, in the mask blank of the present invention, a resist under layer anti-reflective film (BARC: Bottom Anti-Reflective Coating), a resist upper layer anti-reflective film (TARL: Top Anti-Reflective Layer), a resist upper layer protective film, and a conductive film and so forth may be formed, in addition to the aforementioned film.

Hereunder, the manufacturing method of the photomask blank in the first to third embodiments will be explained with reference to the drawings.

Figure 5:
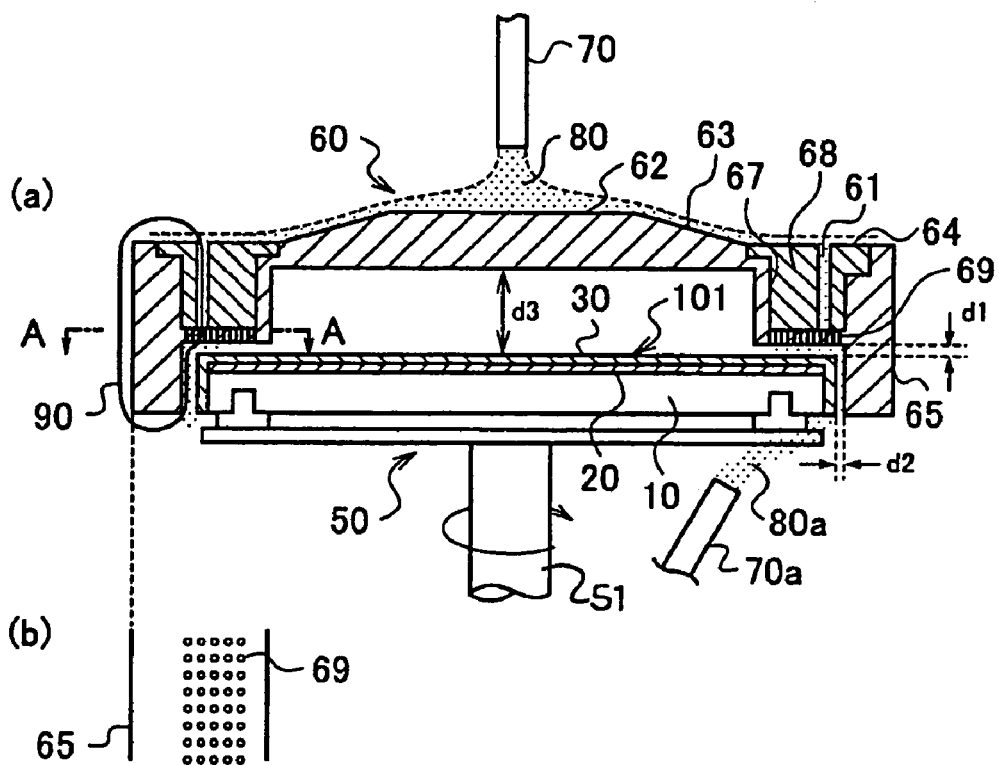
FIG. 5 is an explanatory view of an unnecessary film removing apparatus according to an example of the present invention.
Figure 6:
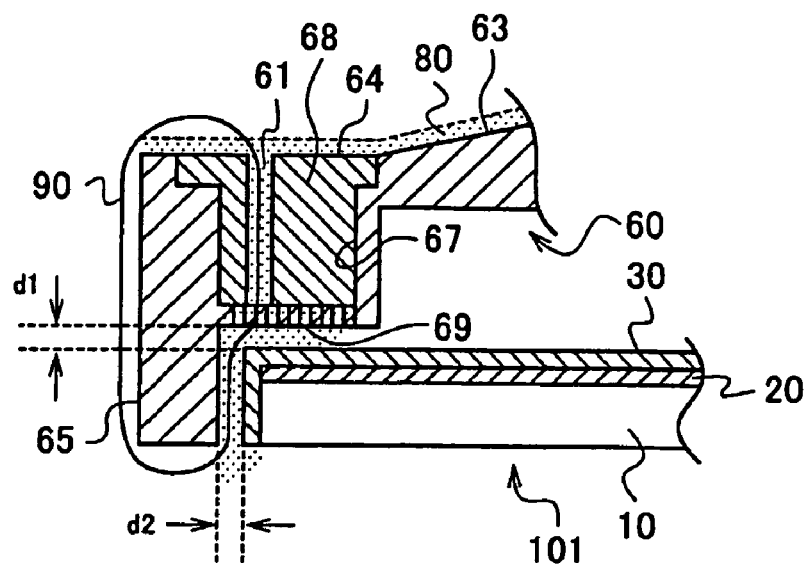
FIG. 6 is a partial expanded sectional view of FIG. 5.
Figure 7:
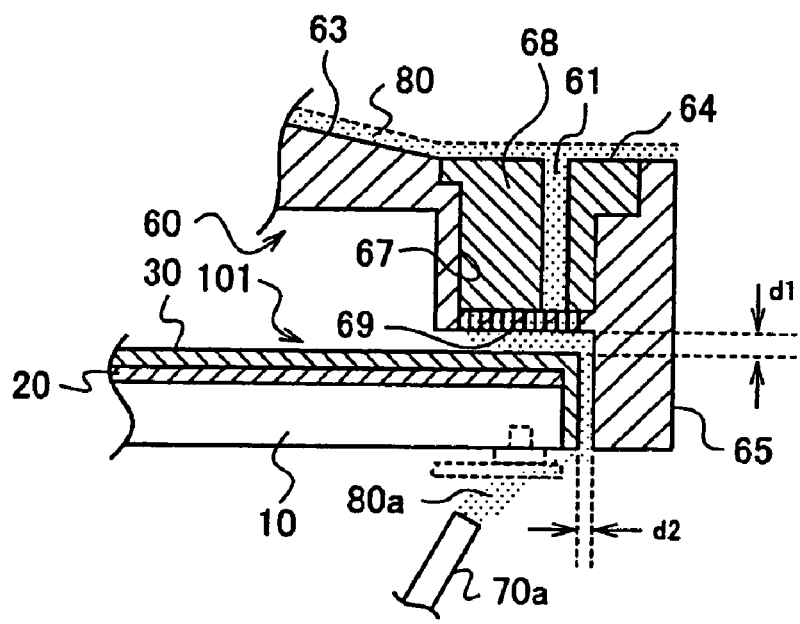
FIG. 7 is a partial expanded sectional view of FIG. 5.
Figure 8:
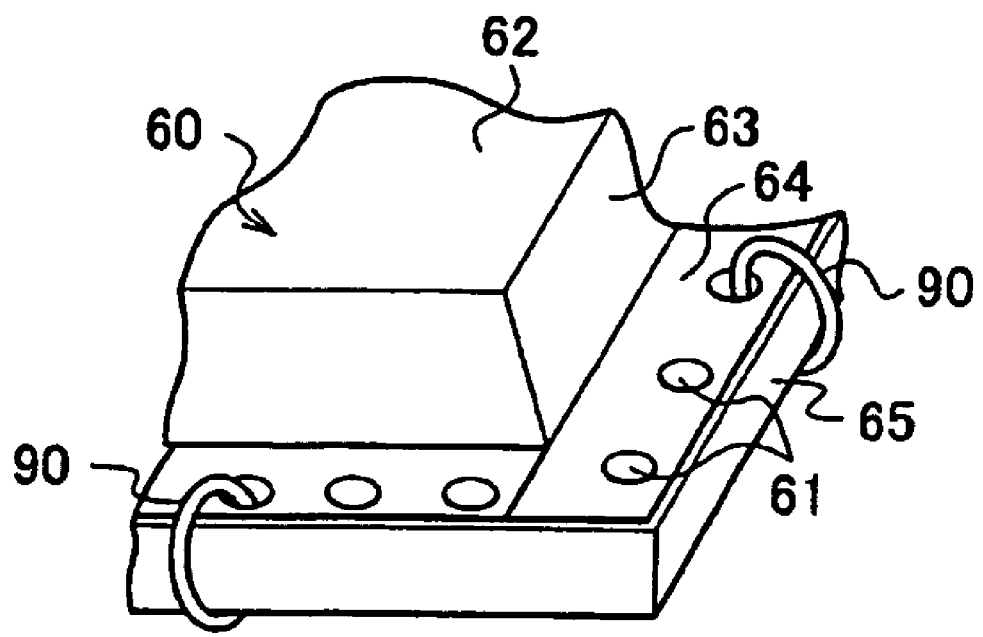
FIG. 8 is a partial expanded perspective view of the unnecessary film removing apparatus according to an example of the present invention.
Figure 9:
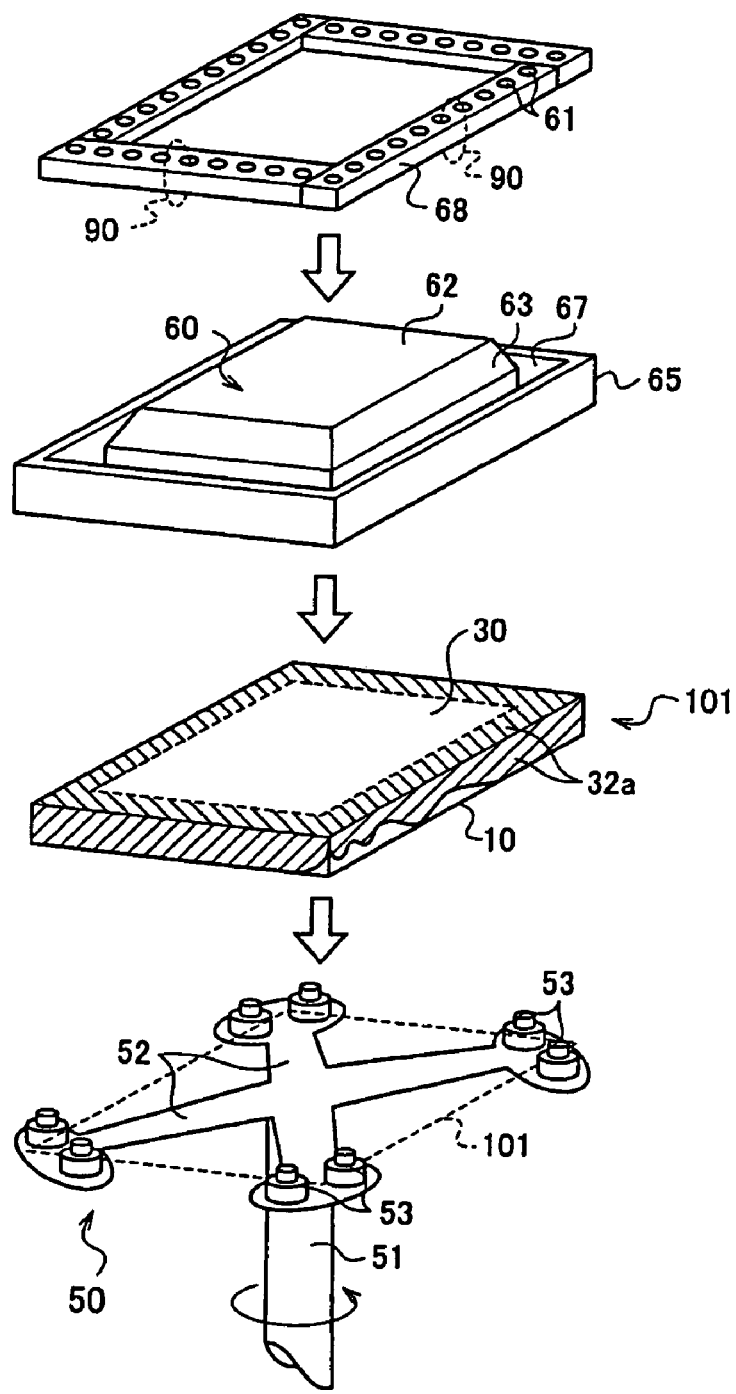
FIG. 9 is an exploded perspective view of the unnecessary film removing apparatus according to an example of the present invention.

First, by using FIGS. 5 to 9, explanation will be given to an unnecessary film removing apparatus for removing the resist film formed in the unnecessary region of the peripheral edge and removing the resist film formed in the supported region corresponding to the substrate holding member of the exposure device in the first embodiment, and removing the resist film formed in the unnecessary region of the peripheral edge in the second embodiment. FIG. 5 is a sectional view showing the structure of the unnecessary film removing apparatus, FIG. 6 and FIG. 7 are partial expanded sectional views of FIG. 5, FIG. 8 is a partial expanded perspective view of the unnecessary film removing apparatus shown in FIG. 5, and FIG. 9 is an exploded perspective view of the unnecessary film removing apparatus shown in FIG. 5.

In FIGS. 5 to 9, explanation will given to the photomask blank (designation mark 101 is assigned to the photomask blank) placed on the unnecessary film removing apparatus. The photomask blank 101 has the substrate 10, and the substrate 10 is the substrate having transparency for the exposure light and the light shielding film 20 is formed on the substrate 10. Further, the resist film 30 in an unbaked state formed by a spin coating method is formed on the light shielding film 20.

As shown in FIG. 5, the unnecessary film removing apparatus has a constitution in which an upper side of the photomask blank 101 placed and held on a turntable 50 is covered with a cover member 60, and chemical liquid 80 for dissolving the resist film 30 is discharged from a nozzle 70 from an upper part of the cover member 60, to be supplied to the unnecessary film part (the part to which the designation mark 32a is assigned in FIG. 9) through a chemical liquid supplying hole 61, thereby dissolving and removing the same.

The cover member 60 covers the photomask blank 101 from the upper part in a covering shape, and a major part from the center to the peripheral edge is a flat part 62. An inclined part 63 is formed from the flat part 62 to an outer peripheral part, a thick peripheral flat part 64 is formed from the inclined part 63 further toward the outer peripheral part, and an outer peripheral end of the peripheral flat part 64 is made to extend below, to form a side part 65.

A chemical liquid supplying member 68 having chemical liquid supplying holes 61, e.g. a plurality of through holes is detachably fitted into the peripheral flat part 64. The chemical liquid supplying member 68 is fitted into a fitting groove 67 provided in the peripheral flat part 64. As shown in FIG. 5(b), the bottom part of the fitting groove 67 has a plurality of holes 69 with smaller diameters than those of the chemical liquid supplying holes 61. The fitting groove 67 has a mesh-like bottom part, and a supply amount of chemical liquid is determined not by the holes 69 but by hole diameters of the chemical liquid supplying holes 61. The chemical liquid supplying member 68 is fitted into the fitting groove 67, to form the flat part. Moreover, a main body of the cover member 60 and the side part 65 are connected to each other by the bottom part of the fitting groove 67.

In addition, a thread 90 (such as resin thread) resistive to chemical liquid is passed through several proper places of the chemical liquid supplying holes 61 of the photomask blank 101, and the size of a gap between an inner wall of the cover member 60 and the surface of the photomask blank 101 is set, with the thread 90 interposed therebetween. Specifically, the thread 90 is formed in a loop shape by passing through the chemical liquid supplying holes 61, and passing the bottom wall of the fitting groove 67 and the outside of the side part 65 of the surface of the photomask blank 101, and the outer peripheral end of the peripheral flat part 64.

A thickness of the thread 90 is determined, so that a size d1 of the gap between the bottom wall of the fitting groove 67 and the surface of the photomask blank 101 is set at a size, with which the chemical liquid can spread in the gap through the gap by surface tension of the chemical liquid when the chemical liquid is supplied to the gap. For example, when the size d1 of the gap is set at 0.05 mm to 3 mm, it becomes difficult for the chemical liquid to spread in the gap through the gap outside this range. Thus, non-removed part is generated, and nicks are thereby formed by the boundary between a removed part and other part.

Further, the size d2 of the gap between the inner wall of the side part 65 and the side surface of the photomask blank 101 may be the size allowing the chemical liquid to pass through the gap while coming into contact with the resist film 30.

In addition, the region of the surface of the photomask blank 101 facing the inner wall of the flat part 62, which occupies a major part from the center of the cover member 60 to the peripheral edge, is the region of a necessary resist film. In this region, the gap between the inner wall of the cover member 60 and the photomask blank 101 is sized larger than d1 to prevent the surface tension of the chemical liquid from acting on the gap. However, the gap is sized at d3, which is larger than the specified size so that the temperature distribution of the resist film 30 of the photomask blank is not affected by heat transfer from the surface of the inner wall of the cover member 60, and which is smaller than the specified size so that the temperature distribution is not generated in the resist film 3 of the photomask blank 101 by convection of gas generated in the gap.

For example, it is preferable to set the d3 at 0.05 mm to 20 mm. This is because when the d3 is set at 0.05 mm or under, the temperature distribution is easily affected by the heat transfer from the cover member 60. For example, when vaporization heat of the chemical liquid acts on the surface of the cover member irregularly, whereby a large temperature distribution is generated, the temperature distribution thus generated is directly reflected on the resist film 30, involving the problem that a fluctuation of the film thickness and sensitivity change are given to the resist film 30. Mean while, when the d3 is set beyond 20 mm, the problem is involved such that the temperature distribution is generated in the resist film.

As described above, the cover member 60 has the chemical liquid supplying holes 61 which supply the chemical liquid supplied by a chemical liquid supplying device to an unnecessary resist film part (the resist film formed in the unnecessary region of the peripheral edge and the resist film formed in the supported region of the substrate holding member of the exposure device), and dissolve and removed the resist films. The chemical liquid supplying holes 61 are provided in the chemical liquid supplying member 68 which is fitted into the fitting groove 67 of the cover member 60. By determining diameters of the chemical liquid supplying holes 61 provided in the chemical liquid supplying member 68 and/or an arrangement of the chemical liquid supplying holes 61, it is possible to adjust a supply amount and/or supplying position of the chemical liquid to be supplied to the unnecessary resist film part through the chemical liquid supplying holes 61. Accordingly, adjustment means that adjusts the supply amount and/or supply position of the chemical liquid can be constructed by preparing a plurality of chemical liquid supplying members 68 having the chemical liquid supplying holes 61, so as to correspond to the supported region of the substrate holding member of each exposure device and/or per each removing width of the unnecessary region of the peripheral edge, thereby exchanging the chemical liquid supplying members thus prepared.

The size and/or the position of the chemical liquid supplying holes of the chemical liquid for removing the unnecessary resist film can be properly adjusted by exchanging the chemical liquid supplying members 68. Therefore, the removing region can be properly controlled without designing, preparing, and exchanging the whole body of the cover member.

The photomask blank 101 thus covered with the cover member 60 into which the chemical liquid supplying member 68 is fitted, is held by a turntable 50 and processed while rotating. The turntable 50 has four radially extending supporting arms 52 attached to a rotating shaft 51 and a pair of holder stands 53 provided at a tip part of each supporting arm 52. The holder stands 53 are arranged at four corners of the photomask blank 101, whereby the photomask blank is held thereon. The rotating shaft 51 is connected to a rotating drive device which is not shown and is rotated by a desired rotational frequency. In addition, a nozzle 7a for supplying chemical liquid is provided in a lower part of the photomask blank 101, and by supplying a chemical liquid 80a from the nozzle 70a, the unnecessary resist film can be surely removed.

Example 1

A first embodiment of the photomask blank is manufactured by the aforementioned unnecessary film removing apparatus as follows.

Figure 10:
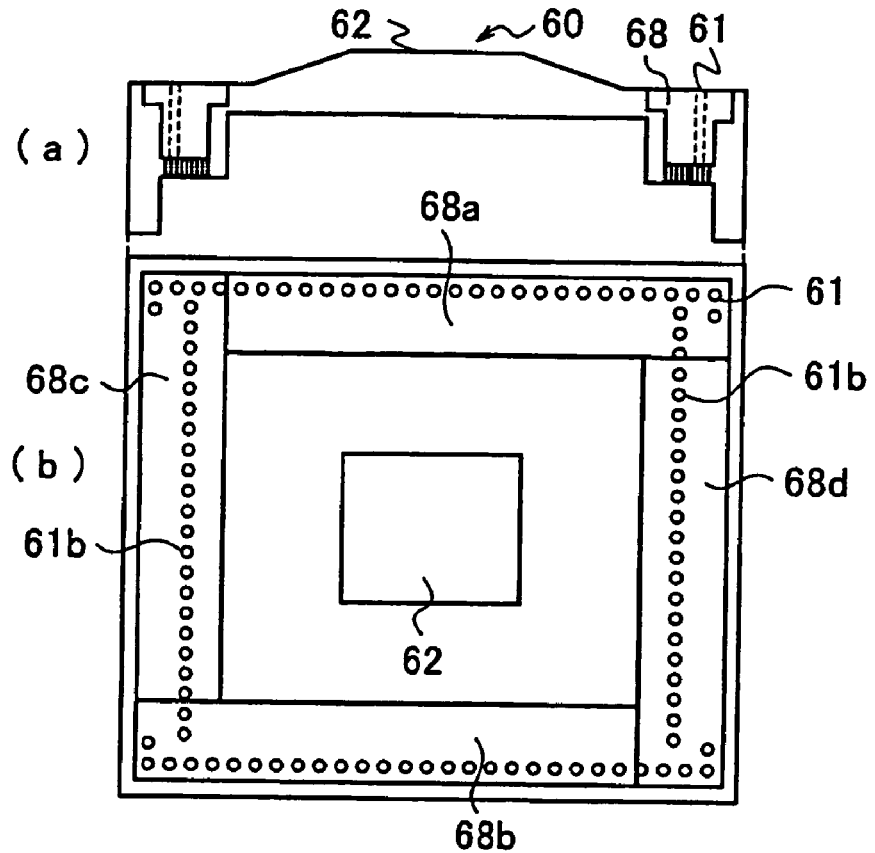
FIG. 10 is an explanatory view of a cover member for manufacturing a photomask blank according to an example of the present invention.

FIG. 10 is a view showing the cover member for manufacturing the photomask blank from which the resist film formed in the unnecessary region of the peripheral edge of the photomask blank and the resist film formed in the supported region corresponding to the substrate holding member of the exposure device are removed. FIG. 10(a) is a sectional view of the cover member, and FIG. 10(b) is a plan view viewed from above the cover member.

Four chemical liquid supplying members 68a to 68d having the chemical liquid supplying holes 61 with predetermined hole diameters are fitted into four sides of the peripheral edge of the cover member 60. By setting the chemical liquid supplying members 68 in the same lengths, one end of each chemical liquid supplying member 68 is sequentially positioned at four corner parts of the cover member 60 when the chemical liquid supplying members 68 are fitted thereinto. Here, the positions of the chemical liquid supplying holes 61, which are linearly arranged along upper and lower sides when the four chemical liquid supplying members 68 are fitted into each other, are formed closer to outside (at a position of about 2 mm from the side surface of the substrate). Also, on the right and left sides, the chemical liquid supplying holes 61b for the substrate holding member are formed closer to inside (at the position of over 10 mm from the side surface of the substrate), so as to remove the resist film of the supported region corresponding to the substrate holding member of the exposure device. Then, in the other region, in the same way as the upper and lower sides, the chemical liquid supplying holes 61 linearly arranged closer to outside are formed.

(a) In a Case of Negative Resist

First, the light shielding film 20 composed of chrome with film thickness of 1000 Å is formed on the substrate 10 by sputtering. Then, the photomask blank 101 formed with an un-baked resist film 30 is formed on the light shielding film 20 by setting it on the turntable 50 and covered with the cover member 60 of FIG. 10. In this state, the chemical liquid 80 is supplied thereto from the nozzle 70 while adjusting the supply amount. (The chemical liquid may be anyone, provided that the resist film is dissolved thereby, and organic solvent or the like is used.) Simultaneously, the turntable 50 is rotated at a rotational frequency of 100 to 1000 rpm for 1 to 60 seconds. Thus, chemical liquid 80 is permeated in the resist film formed in the unnecessary region of the peripheral edge of the photomask blank and the resist film formed in the supported region corresponding to the substrate holding member of the exposure device, through the chemical liquid supplying holes 61, to dissolve and remove the resist film.

Further, when the aforementioned processing is close to a final stage, the chemical liquid 80a is discharged from the nozzle 70a to secure dissolving and removing of the resist film. Next, by executing baking, a photomask blank with resist film was obtained, from which the resist film on the peripheral edge of the photomask blank and the resist film in the supported region corresponding to the substrate holding member of the exposure device were removed.

As shown in FIG. 1, the photomask blank thus obtained has the supported region 31 adjacently to right and left sides, and this part is a resist film removing region, wherein width $a_1$ from the substrate side surface is over 10 mm, and width $b_1$ of the resist film removing region from the substrate side surface provided adjacently to upper and lower sides is 1.8 mm.

(b) In a Case of Positive Resist

When the resist film 30 is a positive resist, the photomask blank can be manufactured by the manufacturing method as will be described hereunder in addition to the aforementioned manufacturing method.

In the photomask blank 101, the light shielding film 20 composed of chrome with film thickness of 1000 Å is formed on the substrate 10 by sputtering, and on the light shielding 20 thus formed, the un-baked resist film 30 is formed. In this photomask blank 101, the unnecessary region of the peripheral edge of the photomask blank and the supported region corresponding to the substrate holding member of the exposure device are exposed to light from an exposure light source through a transmission device such as an optical fiber, whereby the dissolution speed difference by developing solution is obtained between the exposure region and the non-exposure region.

Next, in the same way as the case of the aforementioned (a) negative resist, the photomask blank already exposed to light is set in the unnecessary film removing device, so that the chemical liquid of the developing solution is supplied only to the exposure region. Then, the chemical liquid is permeated in the resist film formed in the unnecessary region of the peripheral edge of the photomask blank and the resist film formed in the supported region corresponding to the substrate holding member of the exposure device, to dissolve and remove the resist films. After dissolving and removing the resist films, by executing baking, the photomask blank with resist film was obtained, from which the resist film of the peripheral edge of the photomask blank and the resist film of the supported region corresponding to the substrate holding member of the exposure device were removed. As shown in FIG. 1, the photomask blank thus obtained also has the supported region 31 provided adjacently to the right and left sides, and this part is a resist film removing region, wherein width $a_1$ from the substrate side surface is over 10 mm, and width $b_1$ of the resist film removing region from the substrate side surface provided adjacently to the upper and lower sides is 1.8 mm.

The manufacturing methods of the photomask blank in the second and third embodiments are applied when the resist film 30 is a positive resist.

Example 2

First, in the photomask blank 101, the light shielding film 20 composed of chrome with film thickness of 1000 Å is formed on the substrate 10 by sputtering, and on the light shielding 20 thus formed, the un-baked resist film 30 is formed. In this photomask blank 101, the unnecessary region of the peripheral edge of the photomask blank and the supported region corresponding to the substrate holding member of the exposure device are exposed to light from an exposure light source through a transmission device such as an optical fiber.

The photomask blank already exposed to light is set in the same unnecessary film removing device as that of the example 1. Here, the cover member 60 formed corresponding to the unnecessary region of the peripheral edge of the photomask blank (cover member having the chemical liquid supplying holes 61 provided corresponding to the position of about 2 mm from the substrate side surface) is set, so that the chemical liquid is supplied only to the unnecessary region of the peripheral edge of the photomask blank. Then, the chemical liquid is permeated in the resist film formed in the unnecessary region of the peripheral edge of the photomask blank, to dissolve and remove the resist film.

By baking the photomask blank from which the resist film formed in the unnecessary region is dissolved and removed, the resist film on the peripheral edge of the photomask blank is removed. Then, the resist film in the supported region corresponding to the substrate holding member of the exposure device is exposed to light, whereby the photomask blank with resist film was obtained, in which the dissolution speed difference by developing solution is obtained between the exposure region and the non-exposure region. As shown in FIG. 2, in the photomask blank thus obtained, the part of the supported region 31 provided adjacently to the right and left sides is the exposure region (the region capable of obtaining the dissolution speed difference by developing solution), wherein width $a_2$ from the substrate side surface is over 10 mm, and width $b_2$ of the resist film removing region from the substrate side surface provided adjacently to the upper and lower and right and left sides is 1.8 mm.

Note that the resist film 30 formed in the supported region corresponding to the substrate holding member of the exposure device is removed in the development processing step in the transfer mask manufacturing step, during formation of the transfer pattern.

In the example 2, after the unnecessary region of the peripheral edge of the photomask blank and the supported region corresponding to the substrate holding member of the exposure device were exposed to light, the chemical liquid of the developing solution was supplied only to the unnecessary region of the peripheral edge of the photomask blank. However, after removing the resist film formed in the unnecessary region of the peripheral edge of the photomask blank first by the chemical liquid of organic solvent, the supported region corresponding to the substrate holding member of the exposure device may be exposed to light.

Example 3

First, in the photomask blank 101, the light shielding film 20 composed of chrome with film thickness of 1000 Å is formed on the substrate 10 by sputtering, and the un-baked resist film 30 is formed on the light shielding film 20. In this photomask blank 101, the supported region corresponding to the substrate holding member of the exposure device is exposed to light from the exposure light source through the transmission device such as the optical fiber, whereby the photomask blank with resist film capable obtaining the dissolution speed difference by developing solution between the exposure region and the non-exposure region was obtained.

In the exposure region, the resist film of the supported region is also removed during formation of the transfer pattern in the development processing step in the manufacturing step of the transfer mask. As shown in FIG. 3, the photomask blank has the supported region 31 adjacently to the right and left sides, e.g. the exposure region (region where the dissolution speed difference by developing solution can be obtained), wherein width $a_3$ from the substrate side surface is over 10 mm.

(Examples 1 to 3 in Common)

In a transfer pattern forming region of the photomask blank with resist film obtained by the aforementioned examples 1 to 3 (inside the supported region and an auxiliary pattern forming region), a hole pattern and a line and space pattern were drawn. Then, by executing development, post-baking, resist releasing, and cleaning, the transfer mask (reticle) was manufactured. In the transfer mask (reticle) thus obtained, the light shielding film was not formed in the supported region corresponding to the substrate holding member of a stepper, but a mirror-finished substrate was exposed.

Figure 11:
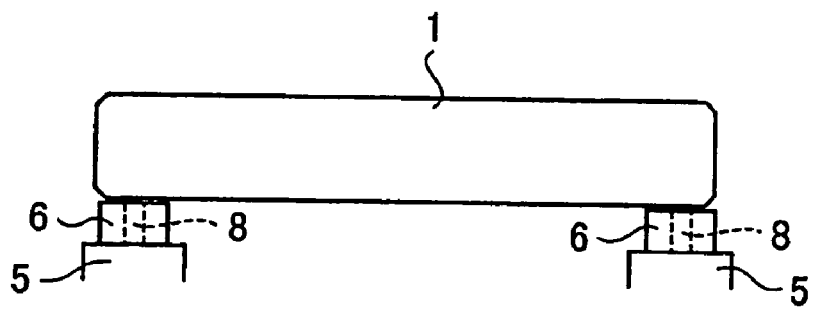
FIG. 11 is a view showing a substrate suction mechanism in a stepper.

Here, in order to conduct a substrate deformation test, in the same way as the substrate holding member of the stepper shown in FIG. 11, a substrate deformation test machine for vacuum-chucking two sides of the substrate was prepared, and a variation in flatness was measured by an optical interferometer (ZygoMarkGPI), by chucking the transfer mask (reticle) thus obtained by the examples 1 to 3 by a vacuum chuck. Then, it was found that the variation in flatness was 0.1 µm or less, and almost no substrate deformation was recognized.

Example 4

In the aforementioned example 1, when the light shielding film 20 is formed on the substrate 101 by sputtering, the light shielding film 20 is formed by blocking so that the light shielding film 20 is not formed in the supported region corresponding to the substrate holding member of the exposure device. Further, after forming the resist film, by using the unnecessary film removing apparatus shown in FIG. 5, the photomask blank with resist film was manufactured in the same way as the example 1, except dissolving and removing only the unnecessary resist film formed on the peripheral edge of the substrate. In this photomask blank, as shown in FIG. 5, the part of the supported region 31 provided adjacently to the right and left sides is the region not formed with the light shielding film, and wide $a_4$ from the substrate side surface is over 10 mm. In the transfer pattern forming region of the photomask blank with resist film (inside the supported region and the auxiliary pattern forming region), the hole pattern and the line and space pattern were drawn, and the transfer mask (reticle) was manufactured by development, post-baking, resist releasing, and cleaning. In the transfer mask (reticle) thus obtained, the light shielding film is not formed in the supported region corresponding to the substrate holding member of the stepper, but the mirror-finished substrate was exposed. Here, in order to conduct the substrate deformation test, in the same way as the substrate holding member of the stepper shown in FIG. 11, the substrate deformation test machine for vacuum-chucking the two sides of the substrate was prepared, and the transfer mask (reticle) obtained by the example 4 was chucked by the vacuum chuck, and the variation in flatness was measured by the optical interferometer (ZygoMarkGPI). Then, it was found that the variation in flatness was 0.1 μm or less, and almost no substrate deformation was recognized.

Referential Example 1

First, in the photomask blank 101 in which the light shielding film 20 composed of chrome with film thickness of 1000 Å is formed on the substrate 10 by sputtering and on the light shielding film 20, the un-baked resist film 30 is formed, the unnecessary region of the peripheral edge of the photomask blank is exposed to light from the exposure light source through the transmission device such as the optical fiber.

The photomask blank already exposed to light is set in the unnecessary film removing apparatus similar to that of the example 1. Here, the cover member 60 formed corresponding to the unnecessary region of the peripheral edge of the photomask blank (cover member having the chemical liquid supplying holes 61 provided corresponding to the position of about 2 mm from the side surface of the substrate) is set. Then, by supplying the chemical liquid of the developing solution only to the unnecessary region of the peripheral edge of the photomask blank, the chemical liquid is permeated in the resist film formed in the unnecessary region of the peripheral edge of the photomask blank, whereby the resist film is dissolved and removed. By executing baking the photomask blank from which the resist film formed in the unnecessary region is dissolved and removed, the photomask blank with resist film, from which the resist film of the peripheral edge of the photomask blank was removed, was obtained.

In the same way as the examples 1 to 4 which are given in common, the hole pattern and the line and space pattern were drawn in the transfer pattern forming region of the photomask blank with resist (inside the supported region and the auxiliary pattern forming region), and by developing, post-baking, resist releasing, and cleaning, the transfer mask (reticle) was manufactured. The boundary of the light shielding film was formed in the supported region corresponding to the substrate holding member of the stepper in the transfer mask (reticle) thus obtained, and a level difference was formed on the mirror-finished substrate by the film thickness of the light shielding film (1000 Å).

Further, in the same way as the examples 1 to 4 executed in common, when the variation in flatness was measured by the substrate deformation test machine, the substrate deformation was about 0.2 μm. By using the transfer mask manufactured in the aforementioned example and the transfer mask manufactured in the referential example, the transfer pattern formed in the transfer mask was transferred on the semiconductor substrate by the publicly-known lithography method (ArF excimer laser was set as the exposure light source), to form a pattern. As a result, in regards to the focus accuracy and the pattern positional accuracy by using only the transfer mask, the example revealed an improvement of 6 nm (improvement of 50% or more) in the focus accuracy compared with the referential example, and the example revealed an improvement of 25 nm (improvement of 50% or more) in the pattern positional accuracy compared with the referential example.

As is clear from the result described above, it is found that the mask blank thus constituted is capable of suppressing the substrate deformation when the transfer mask is mounted on the exposure device, thereby suppressing the lowering of the pattern positional accuracy and the lowering of the focus accuracy to minimum.

In the aforementioned example, the resist film of the supported region corresponding to the substrate holding member of the exposure device which is removed or exposed to light has been explained. However, the application of the present invention is not limited thereto, and in the transfer mask formed with the auxiliary pattern such as the bar code pattern and the QA pattern in the supported region, the chemical liquid supplying member may be mounted on the cover member, so that the resist film corresponding to the region where the auxiliary pattern is formed remains.

By remaining the resist film in the aforementioned region, the deformation of the reticle by the vacuum chuck is suppressed, thereby suppressing the lowering of the positional accuracy of the transfer pattern and the lowering of the focus accuracy to minimum.

Further, in the aforementioned embodiment, explanation has been given to a case in which a predetermined region of the supported region corresponding to the substrate holding member of the exposure device is designed in the manufacturing step of the transfer mask, so that the thin film is not formed in the stage of the mask blank (designed not to form the thin film, to remove the resist film, and to apply an exposure process to the resist film). However, the case is not limited thereto, and in the manufacturing step of the transfer mask, it may be so designed that the thin film is not formed in the predetermined region in the supported region corresponding to the substrate holding member of the exposure device.

INDUSTRIAL APPLICABILITY

According to the photomask blank of the present invention, when the transfer mask having the transfer pattern obtained by patterning the thin film is supported by the substrate holding member of the exposure device, the thin film and/or the resist film formed in the peripheral edge of the substrate main surface is removed in the predetermined region in the supported region of the mask blank supported by the substrate holding member of the exposure device, so that a desired pattern positional accuracy and a desired focus accuracy are obtained. Therefore, when the transfer mask is mounted on the substrate holding member of the exposure device, the deformation of the transfer mask can be suppressed and the lowering of the positional accuracy of the transfer pattern and the lowering of the focus accuracy can be suppressed to minimum.

In addition, according to the manufacturing method of the photomask blank of the present invention, after a resist coating step, the predetermined region in the supported region of the mask blank supported by the substrate holding member of the exposure device is exposed to light, so that a desired pattern positional accuracy and a desired focus accuracy can be obtained when the transfer mask having the transfer pattern obtained by patterning the thin film is supported by the substrate holding member of the exposure device, and a dissolution speed difference by developing solution is obtained between the exposure region and the non-exposure region. Therefore, the resist film and the thin film in the supported region of the mask blank supported by the holding member of the exposure device are removed during formation of the transfer pattern in the development processing step and the etching processing step in the transfer mask manufacturing step. Accordingly, when the transfer mask is mounted on the substrate holding member of the exposure device, the photomask blank capable of suppressing the deformation of the transfer mask and suppressing the lowering of the positional accuracy of the transfer pattern and the lowering of the focus accuracy to minimum can be manufacture easily.

Further, according to the manufacturing method of the transfer mask of the present invention, the resist film and the thin film of the predetermined region in the supported region of the mask blank supported by the substrate holding member of the exposure device are removed, so that the desired pattern positional accuracy and the desired focus accuracy are obtained. Therefore, when the transfer mask is mounted on the substrate holding member of the exposure device, the deformation of the transfer mask is suppressed, and the lowering of the positional accuracy of the transfer pattern and the lowering of the focus accuracy can be suppressed to minimum.

The invention claimed is:

1. A mask blank, which is an original plate for manufacturing a transfer mask, comprising:
   a substrate including a main surface, and a substrate peripheral edge having an unnecessary region;
   a thin film formed on the main surface of the substrate;
   a resist film formed on the thin film; and
   a supported region of the mask blank, the supported region being located inside the unnecessary region of the substrate peripheral edge on the main surface of the substrate, and the supported region being a region supported by a substrate holding member of an exposure device when a transfer is carried out by using the transfer mask,
   wherein the resist film is not formed in the supported region of the mask blank.

2. The mask blank according to claim 1, further comprising an auxiliary pattern forming region for an auxiliary pattern formed on the transfer mask when the transfer mask is manufactured from the mask blank, the auxiliary pattern forming region being located inside the unnecessary region,
   wherein the thin film and the resist film are formed on the auxiliary pattern forming region.

3. The mask blank according to claim 1, wherein the resist film is a positive resist.

4. The mask blank according to claim 1, wherein the resist film is not formed on the unnecessary region.

5. A mask blank, which is an original plate for manufacturing a transfer mask, comprising:
   a substrate, including a main surface, and a substrate peripheral edge having an unnecessary region;
   a thin film formed on the main surface of the substrate;
   a positive resist film formed on the thin film; and
   a supported region of the mask blank, the supported region being located inside the unnecessary region of the substrate peripheral edge on the main surface of the substrate, and the supported region being a region supported by a substrate holding member of an exposure device when a transfer is carried out by using the transfer mask,
   wherein the positive resist film in the supported region of the mask blank is exposed to light, so as to remove the positive resist film in the supported region when the positive resist film is developed.

6. The mask blank according to claim 5, further comprising an auxiliary pattern forming region for an auxiliary pattern that is formed on the transfer mask when the transfer mask is manufactured from the mask blank, the auxiliary pattern forming region being located inside the unnecessary region,
   wherein the auxiliary pattern forming region is a non-exposure region not exposed to light.

7. The mask blank according to claim 5, wherein the resist film is not formed on the unnecessary region.

8. A manufacturing method of a mask blank, which is an original plate for manufacturing a transfer mask, the method comprising:
   forming a thin film on a main surface of a substrate, the substrate including a substrate peripheral edge having an unnecessary region;
   applying a positive resist on the thin film to form a positive resist film; and
   exposing the positive resist film on a supported region of the mask blank to light, so as to remove the positive resist film when the positive resist film is developed,
   wherein the supported region of the mask blank, which is located inside the unnecessary region of the substrate peripheral edge on the main surface of the substrate, is a region to be supported by a substrate holding member of an exposure device when a transfer is carried out by using the transfer mask.

9. The manufacturing method of the mask blank according to claim 8, further comprising:
   exposing the positive resist film on the unnecessary region to light;
   supplying a developing solution selectively to the supported region and the unnecessary region exposed to light after exposing the positive resist film; and
   removing the positive resist film formed on the supported region and the unnecessary region.

10. A manufacturing method of a transfer mask, comprising;
    preparing the mask blank according to claim 1; and
    forming a transfer pattern and removing the thin film formed on the supported region of the mask blank by carrying out an etching for manufacturing the transfer mask.

11. A manufacturing method of a transfer mask, the method comprising:
    preparing the mask blank according to claim 5; and
    forming a transfer pattern and removing the thin film formed on the supported region of the mask blank by carrying out an etching for manufacturing the transfer mask.

12. A transfer mask, the mask comprising:
    a substrate including a main surface, and a substrate peripheral edge having an unnecessary region;

a thin film on the main surface of the substrate in which a transfer pattern is formed by a positive resist;

a supported region of the transfer mask, which is located inside an unnecessary region of the substrate peripheral edge on the main surface of the substrate, and is supported by a substrate holding member of an exposure device when a transfer is carried out by using the transfer mask, wherein the thin film is not formed in the supported region of the transfer mask.

13. A manufacturing method of a semiconductor device, comprising;

preparing the transfer mask according to claim 12;

supporting the supported region of the transfer mask with the substrate holding member of the exposure device; and transferring the transfer pattern on a semiconductor substrate by a lithography method to form a pattern.

* * * * *